United States Patent
Jang et al.

(10) Patent No.: US 6,599,847 B1
(45) Date of Patent: *Jul. 29, 2003

(54) SANDWICH COMPOSITE DIELECTRIC LAYER YIELDING IMPROVED INTEGRATED CIRCUIT DEVICE RELIABILITY

(75) Inventors: Syun-Ming Jang, Hsin-Chu (TW); Chen-Hua Yu, Hsin-Chu (TW)

(73) Assignee: Taiwan Semiconductor Manufacturing Company, Hsin-Chu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/697,699

(22) Filed: Aug. 27, 1996

(51) Int. Cl.$^7$ .......................................... H01L 21/469
(52) U.S. Cl. .................. 438/787; 438/624; 438/788; 438/789
(58) Field of Search .................. 437/238; 438/787, 788, 789, 624

(56) References Cited

U.S. PATENT DOCUMENTS

| | | | | |
|---|---|---|---|---|
| 4,732,761 A | * | 3/1988 | Machida et al. | 437/228 |
| 5,128,279 A | * | 7/1992 | Nariani et al. | 438/624 |
| 5,252,520 A | * | 10/1993 | Kocmanek et al. | 437/235 |
| 5,254,497 A | * | 10/1993 | Liu | 438/624 |
| 5,286,518 A | * | 2/1994 | Cain et al. | 427/96 |
| 5,344,797 A | * | 9/1994 | Pai et al. | 437/238 |
| 5,376,590 A | * | 12/1994 | Machida et al. | 438/624 |
| 5,403,780 A | * | 4/1995 | Jain et al. | 438/624 |
| 5,459,105 A | | 10/1995 | Matsuura | 437/228 |
| 5,503,882 A | * | 4/1996 | Dawson | 427/579 |
| 5,556,806 A | * | 9/1996 | Pan et al. | 438/624 |
| 5,663,092 A | * | 9/1997 | Lee | 438/624 |
| 5,736,423 A | * | 4/1998 | Ngo | 437/238 |

OTHER PUBLICATIONS

The Reader's Digest Great Encyclopedic Dictionary Third Edition (Including Funk & Wagnalls Standard College Dictionary), The Reader's Digest Association, Pleasantville, NY (1969). pp 337, 350–51.

* cited by examiner

*Primary Examiner*—Carl Whitehead, Jr.
*Assistant Examiner*—Thanh Nguyen
(74) *Attorney, Agent, or Firm*—George O. Saile; Stephen B. Ackerman

(57) ABSTRACT

A method for forming for use within an integrated circuit a gap filling sandwich composite dielectric layer construction, and an integrated circuit having formed therein the gap filling sandwich composite dielectric layer construction. To practice the method, there is first provided a substrate having formed thereover a patterned layer. There is then formed upon the patterned layer a first conformal dielectric layer through a first plasma enhanced chemical vapor deposition (PECVD) method employing a first radio frequency power optimized primarily to limit plasma induced damage to the substrate and the patterned layer. The first radio frequency power is also optimized secondarily to limit moisture permeation through the first conformal dielectric layer. There is then formed upon the first conformal dielectric layer a gap filling dielectric layer. Finally, there is formed upon the gap filling dielectric layer a second conformal dielectric layer through a second plasma enhanced chemical vapor deposition (PECVD) method employing a second radio frequency power optimized primarily to limit moisture permeation through the second conformal dielectric layer.

9 Claims, 2 Drawing Sheets

SANDWICH COMPOSITE DIELECTRIC LAYER YIELDING IMPROVED INTEGRATED CIRCUIT DEVICE RELIABILITY

BACKGROUND OF THE INVENTION

1. Field of the Invention

The present invention relates generally to dielectric layers within integrated circuits. More particularly, the present invention relates to sandwich composite dielectric layer constructions which yield improved electrical circuit device reliability within integrated circuits.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

Within advanced integrated circuits having formed therein narrow linewidth electrical circuit elements and patterned layers, such as but not limited to patterned conductor layers, which define narrow pitch and high aspect ratio apertures, it has become increasingly important within those advanced integrated circuits to form dielectric layers, such as but not limited to inter-metal dielectric (IMD) layers, which possess superior gap filling and moisture impermeability characteristics in order to efficiently fill the narrow pitch and high aspect ratio apertures within those integrated circuits while simultaneously providing a diffusion barrier to moisture which might otherwise compromise the functionality and reliability of electrical circuit elements which are formed within those integrated circuits. With respect to dielectric layers which possess such superior gap filling and moisture impermeability characteristics, sandwich composite dielectric layer constructions which employ a gap filling dielectric layer sandwiched between a pair of conformal dielectric layers have received continuing interest and attention. A common sandwich composite dielectric layer construction which exhibits superior gap filling and moisture impermeability characteristics employs a lower lying conformal dielectric layer and an upper lying conformal dielectric layer formed from a silicon oxide dielectric material deposited through a plasma enhanced chemical vapor deposition (PECVD) method employing tetra-ethyl-ortho-silicate (TEOS) as a silicon source material, with plasma reactor parameters typically optimized inhibit moisture permeation through the lower lying conformal dielectric layer and upper lying conformal dielectric layer. Within such a sandwich composite dielectric layer construction, the lower lying conformal dielectric layer and the upper lying conformal dielectric layer sandwich a middle gap filling dielectric layer typically formed of either a spin-on-glass (SOG) silicon oxide dielectric layer or an ozone assisted atmospheric pressure chemical vapor deposited (APCVD) silicon oxide dielectric layer. Typically, the upper lying conformal dielectric layer within the gap filling sandwich composite dielectric layer construction so formed is subsequently planarized through a chemical mechanical polish (CMP) planarizing method, as is common in the art, to form a gap filling and planarizing sandwich composite dielectric layer construction.

While the gap filling sandwich composite dielectric layer constructions or gap filling and planarizing sandwich composite dielectric layer constructions formed through the two permutations of the foregoing conformal dielectric layers and gap filling dielectric layers are known in the art to form gap filling sandwich composite dielectric layer constructions or gap filling and planarizing sandwich composite dielectric layer constructions which may be employed as dielectric layers, including but not limited to inter-metal dielectric (IMD) layers, within integrated circuits having narrow pitch and high aspect ratio apertures defined by narrow linewidth electrical circuit elements and/or patterned layers formed therein, the gap filling sandwich composite dielectric layer constructions or gap filling and planarizing sandwich composite dielectric layer constructions formed through the two permutations of the foregoing conformal dielectric layers and gap filling dielectric layers are not without problems. In that regard, it becomes increasingly important within advanced integrated circuits within which there are formed electrical circuit elements and patterned layers, such as but not limited to patterned conductor layers, of increasingly narrower linewidth dimension which define narrow pitch and high aspect ratio apertures, to form gap filling sandwich composite dielectric layer constructions or gap filling and planarizing sandwich composite dielectric layer constructions in a fashion such that those electrical circuit elements and patterned layers of diminished linewidth dimension continue to be adequately protected from moisture permeation while simultaneously not being damaged through the plasma enhanced chemical vapor deposition (PECVD) method through which is formed the gap filling sandwich composite dielectric layer construction or gap filling and planarizing sandwich composite dielectric layer construction. It is towards that goal that the present invention is generally directed.

With regard to protection from moisture permeation through gap filling and planarizing sandwich composite dielectric layer constructions of narrow linewidth electrical circuit elements and patterned layers, there has been disclosed in the art gap filling and planarizing sandwich composite dielectric layer constructions formed from layers with enhanced crack resistance. See, for example, Matsuura, U.S. Pat. No. 5,459,105. With regard, in general, to limiting damage to electrical circuit elements and patterned layers upon which are formed plasma enhanced chemical vapor deposited (PECVD) dielectric layers within integrated circuits, it is generally understood in the art that electrical circuit elements and patterned layers of narrower dimensions are more susceptible to electrostatically and electrodynamically plasma induced damage due to: (1) a limited ability of electrical circuit elements and patterned layers of narrower dimension to store charges; and (2) an enhanced ability to discharge such charges across narrow dielectric dimensions.

It is therefore desirable in the art to form upon electrical circuit elements and patterned layers having a narrow linewidth, a narrow aperture width and a high aspect ratio, within integrated circuits, gap filling sandwich composite dielectric layer constructions or gap filling and planarizing sandwich composite dielectric layer constructions without damaging those electrical circuit elements and patterned layers, while simultaneously providing gap filling sandwich composite dielectric layer constructions or gap filling and planarizing sandwich composite dielectric layer constructions with optimal moisture impermeability. It is towards these goals that the present invention is specifically directed.

SUMMARY OF THE INVENTION

A first object of the present invention is to provide a method for forming for use within an integrated circuit a gap filling sandwich composite dielectric layer construction.

A second object of the present invention is to provide a method in accord with the first object of the present invention, where when forming the gap filling and planarizing sandwich composite dielectric layer construction there is not sustained plasma damage by electrical circuit elements and patterned layers formed beneath the gap filling sandwich composite dielectric layer construction.

A third object of the present invention is to provide a method in accord with the first object of the present invention, where the gap filling sandwich composite dielectric layer construction provides optimal moisture impermeability to electrical circuit elements and patterned layers formed beneath the gap filling sandwich composite dielectric layer construction.

A fourth object of the present invention is to provide a method in accord with the second object of the present invention and the third object of the present invention, which method is readily manufacturable.

In accord with the objects of the present invention there is provided by the present invention a method for forming for use within an integrated circuit a gap filling sandwich composite dielectric layer construction. To form the gap filling sandwich composite dielectric layer construction of the present invention, there is first provided a substrate having a patterned layer formed thereover. There is then formed upon the patterned layer a first conformal dielectric layer, where the first conformal dielectric layer is formed through a first plasma enhanced chemical vapor deposition (PECVD) method employing a first radio frequency power optimized primarily to limit plasma induced damage to the substrate and the patterned layer. The first radio frequency power is also optimized secondarily to limit moisture permeation through the first conformal dielectric layer. There is then formed upon the first conformal dielectric layer a gap filling dielectric layer. Finally, there is formed upon the gap filling dielectric layer a second conformal dielectric layer, where the second conformal dielectric layer is formed through a second plasma enhanced chemical vapor deposition (PECVD) method employing a second radio frequency power optimized primarily to limit moisture permeation through the second conformal dielectric layer.

Through the method of the present invention, there is formed a gap filling sandwich composite dielectric layer construction for use within an integrated circuit, where the gap filling sandwich composite dielectric layer construction provides optimal moisture impermeability to electrical circuit elements and patterned layers formed beneath the gap filling sandwich composite dielectric layer construction while simultaneously avoiding plasma induced damage to electrical circuit elements and patterned layers formed beneath the gap filling sandwich composite dielectric layer construction. Through the method of the present invention, there is formed upon a patterned layer and over a substrate: (1) a first conformal dielectric layer, where the first conformal dielectric layer is formed through a first plasma enhanced chemical vapor deposition (PECVD) method employing a first radio frequency power optimized primarily to limit plasma induced damage to the substrate and the patterned layer and optimized secondarily to limit moisture permeation through the first conformal dielectric layer; and (2) a second conformal dielectric layer separated from the first conformal dielectric layer by a gap filling dielectric layer, where the second conformal dielectric layer is formed through a second plasma enhanced chemical vapor deposition (PECVD) method employing a second radio frequency power optimized primarily to limit moisture permeation through the second conformal dielectric layer. By forming the first conformal dielectric layer and the second conformal dielectric layer through separate plasma enhanced chemical vapor deposition (PECVD) methods optimized primarily towards separate properties of the gap filling sandwich composite dielectric layer construction, there is formed through the method of the present invention a gap filling sandwich composite dielectric layer construction, where the gap filling sandwich composite dielectric layer construction exhibits optimal moisture impermeability for electrical circuit elements and patterned layers formed beneath the sandwich composite dielectric layer construction while simultaneously avoiding plasma induced damage to electrical circuit elements and patterned layers formed beneath the gap filling sandwich composite dielectric layer construction.

The method of the present invention is readily manufacturable. Through the method of the present invention a first conformal dielectric layer and a second conformal dielectric layer within a gap filling sandwich composite dielectric layer construction are formed through separate plasma enhanced chemical vapor deposition (PECVD) methods having separate radio frequency powers optimized to provide separate properties within the gap filling sandwich composite dielectric layer construction. Plasma enhanced chemical vapor deposition (PECVD) methods are in general known in the art of fabricating conformal dielectric layers within integrated circuits, and it is also known within the art of forming plasma enhanced chemical vapor deposited (PECVD) conformal dielectric layers that radio frequency power plays a part in properties exhibited by those plasma enhanced chemical vapor deposited (PECVD) conformal dielectric layers. Thus, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming for use within an integrated circuit a gap filling sandwich composite dielectric layer construction which exhibits optimal moisture impermeability to electrical circuit elements and patterned layers formed beneath the gap filling sandwich composite dielectric layer construction while simultaneously avoiding plasma induced damage to electrical circuit elements and patterned layers formed beneath the gap filling sandwich composite dielectric layer construction. The method of the present invention achieves these goals by employing when forming the gap filling sandwich composite dielectric layer construction: (1) a first conformal dielectric layer formed through a first plasma enhanced chemical vapor deposition (PECVD) method at a first radio frequency plasma power optimized primarily to limit damage to electrical circuit elements and patterned layers formed beneath the first conformal dielectric layer and optimized secondarily to limit moisture permeation through the first conformal dielectric layer; and (2) a second conformal dielectric layer separated from the first conformal dielectric layer by a gap filling layer, where the second conformal dielectric layer is formed through a second plasma enhanced chemical vapor deposition (PECVD) method employing a second radio frequency plasma power optimized primarily to limit moisture permeation through the second conformal dielectric layer.

The gap filling sandwich composite dielectric layer construction formed through the method of the present invention may be employed within various types of integrated circuits. The gap filling sandwich composite dielectric layer construction formed through the method of the present invention may be employed within integrated circuits including but not limited to dynamic random access memory (DRAM) integrated circuits, static random access memory (SRAM) integrated circuits, application specific integrated circuits (ASICs), integrated circuits having within their fabrications field effect transistors (FETs), integrated circuits having within their fabrication bipolar transistors and integrated circuits having within their fabrications bipolar complementary metal oxide semiconductor (BiCMOS) transistors.

Figure 1:
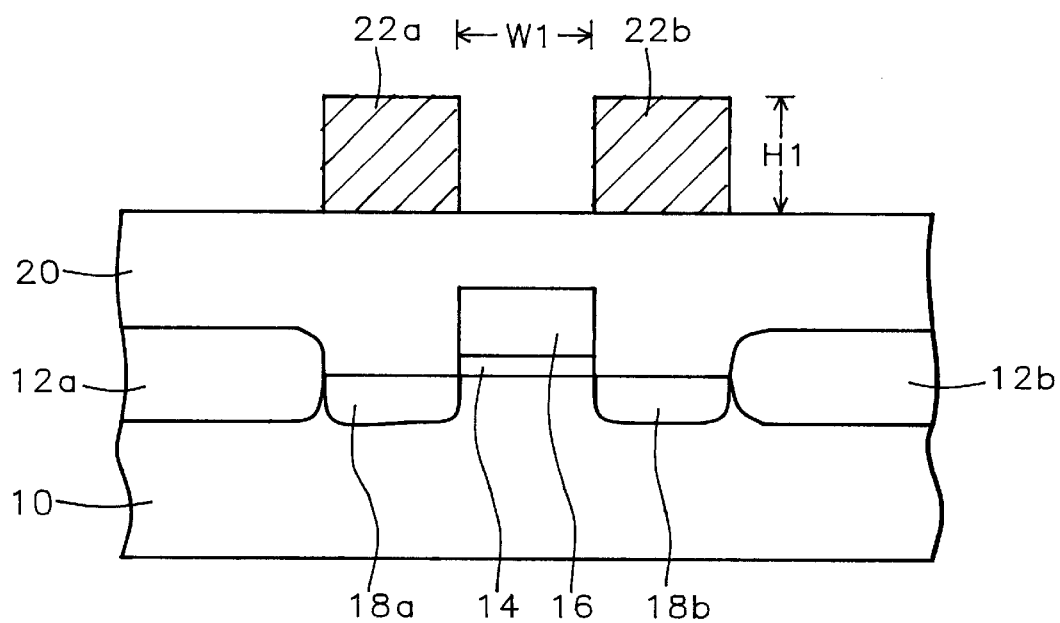
FIG. 1 to FIG. 3 show a series of schematic cross-sectional diagrams illustrating the results of progressive stages of forming within an integrated circuit multiple gap filling sandwich composite dielectric layer constructions through the preferred embodiment of the method of the present invention.
Figure 2:
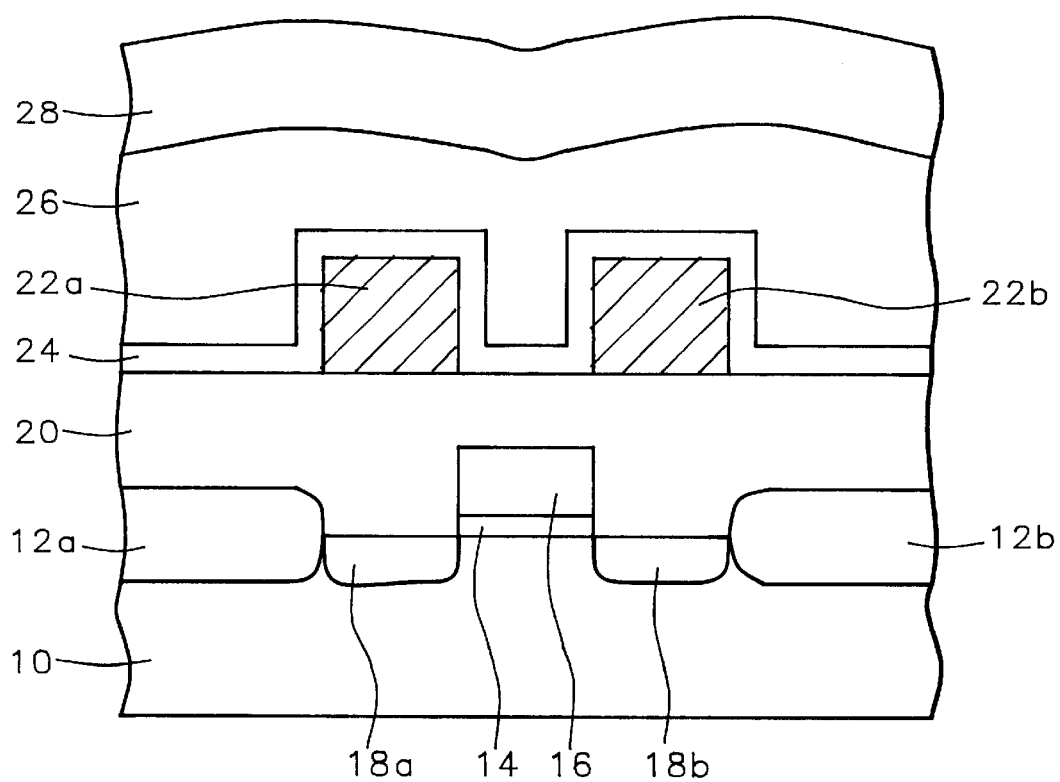
Figure 3:
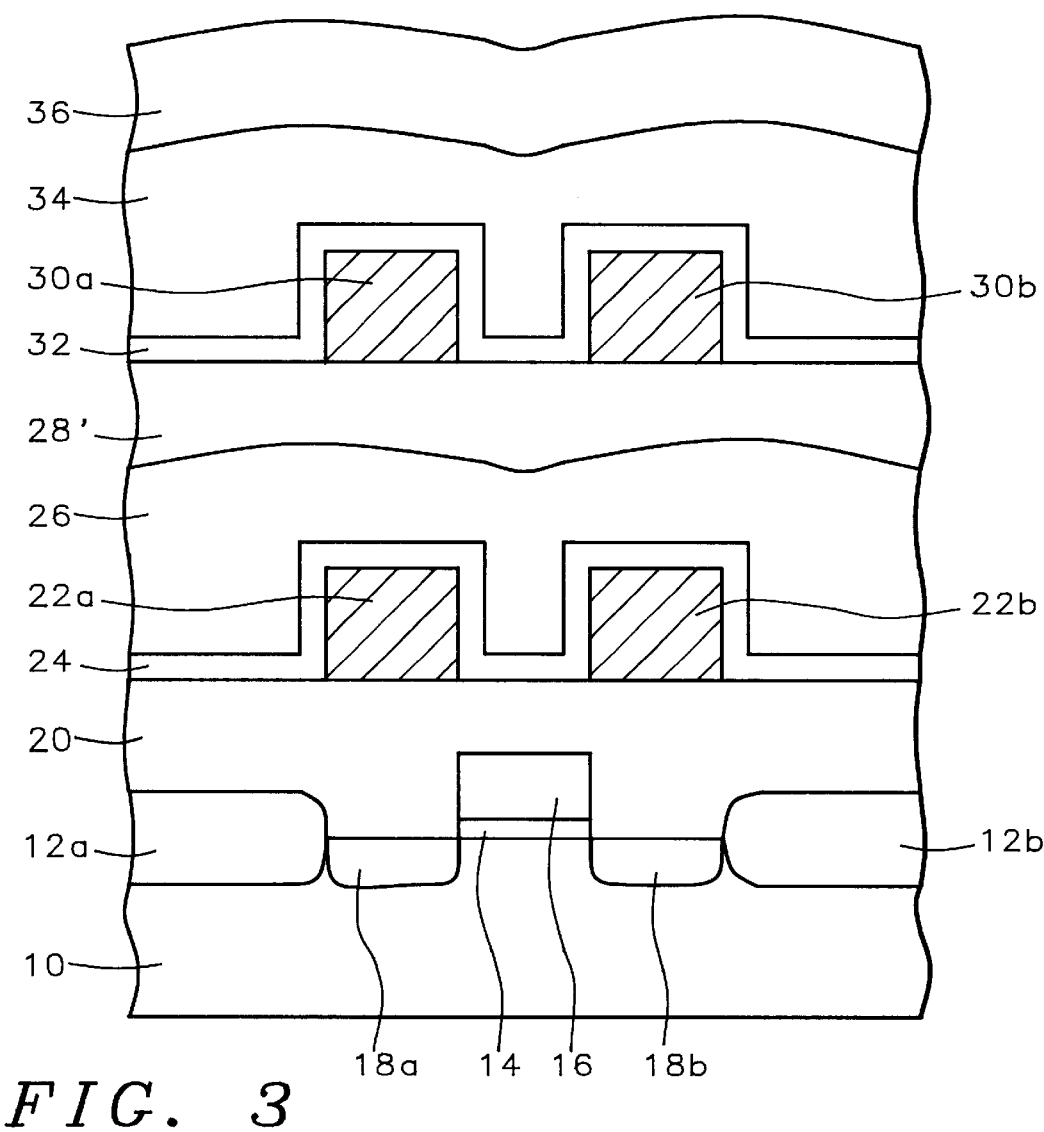

Referring now to FIG. 1 to FIG. 3 there is shown a series of schematic cross-sectional diagrams illustrating the results of progressive stages in forming within an integrated circuit a pair of gap filling sandwich composite dielectric layer constructions through the preferred embodiment of the method of the present invention. Shown in FIG. 1 is a schematic cross-sectional diagram of the integrated circuit at the early stages in its formation.

Shown in FIG. 1 is a semiconductor substrate 10 having formed within and upon its surface a pair of isolation regions 12a and 12b which define the active region of the semiconductor substrate 10. Although semiconductor substrates are known in the art with either dopant polarity, various dopant concentrations and several crystallographic orientations, for the preferred embodiment of the present invention, the semiconductor substrate 10 is preferably a (100) silicon semiconductor substrate having an N- or P-doping. Similarly, although it is known in the art that isolation regions may be formed within and/or upon semiconductor substrates through several methods, including but not limited to isolation region growth methods and isolation region deposition/patterning methods, for the preferred embodiment of the present invention, the isolation regions 12a and 12b are preferably formed within and upon the semiconductor substrate 10 through an isolation region growth method at a temperature of from about 800 to about 1000 degrees centigrade to form isolation regions 12a and 12b of silicon oxide within and upon the semiconductor substrate 10.

There is also shown within FIG. 1, within the active region of the semiconductor substrate 10, several components from which is comprised a field effect transistor (FET). The components include: (1) a gate dielectric layer 14; (2) a gate electrode 16; and (3) a pair of source/drain regions 18a and 18b. Each of the preceding components from which is comprised the field effect transistor (FET) may be formed through methods as are conventional in the art of forming field effect transistors (FETs).

For example, gate dielectric layers are typically, although not exclusively, formed within field effect transistors (FETs) for use within integrated circuits through patterning through methods as are conventional in the art of blanket gate dielectric layers formed within those integrated circuits. The blanket gate dielectric layers may be formed through methods including but not limited to blanket gate dielectric layer growth methods and blanket gate dielectric layer deposition methods. In addition gate electrodes are typically, although not exclusively, formed within field effect transistors (FETs) for use within integrated circuits through patterning through methods as are conventional in the art of blanket layers of gate electrode materials formed upon blanket gate dielectric layers within those integrated circuits. Blanket layers of gate electrode materials may be formed within integrated circuits through methods including but not limited to thermally assisted evaporation methods, chemical vapor deposition (CVD) methods and physical vapor deposition (PVD) sputtering methods through which may be formed blanket layers of gate electrode materials formed of gate electrode materials including but not limited to metals, metal alloys, highly doped polysilicon and polycides (highly doped polysilicon/metal silicide stacks). Finally, source drain regions are typically formed within field effect transistors (FETs) for use within integrated circuits through ion implantation methods employing dopant ions of polarity appropriate to the field effect transistors (FETs) desired to be formed.

Thus, for the preferred embodiment of the present invention, the gate dielectric layer 14 is preferably formed through photolithographic and reactive ion etch (RIE) etching methods as are conventional in the art of a blanket gate dielectric layer formed upon the active region of the semiconductor substrate 10 through thermal oxidation of the active region of the semiconductor substrate 10 at a temperature of from about 800 to about 1000 degrees centigrade to form a gate dielectric layer 14 of silicon oxide having a thickness of from about 60 to about 100 angstroms. Similarly, the gate electrode 16 is preferably formed through patterning through photolithographic and reactive ion etch (RIE) etching methods as are conventional in the art of a blanket layer of gate electrode material formed of highly doped polysilicon or a polycide formed upon the blanket gate dielectric layer. Preferably, the gate electrode 16 so formed is from about 2000 to about 3000 angstroms thick. Finally, the source/drain regions 18a and 18b are preferably formed through implanting a suitable dopant ion into the active region of the semiconductor substrate 10 while employing the gate dielectric layer 14 and the gate electrode 16 as a mask at an ion implantation dose of from about 4E13 to about 8E13 ions per square centimeter and an ion implantation energy of from about 80 to about 120 keV.

There is also shown in FIG. 1 a planarized pre-metal dielectric (PMD) layer 20 formed upon the semiconductor substrate 10, including the components which comprise the field effect transistor (FET). Methods and materials through which planarized dielectric layers may in general be formed within integrated circuits are know in the art of integrated circuit fabrication. Planarized dielectric layers are typically, although not exclusively, formed within integrated circuits through planarizing, through planarizing methods as are conventional in the art, of conformal dielectric layers formed within those integrated circuits. The conformal dielectric layers may be formed within integrated circuits through methods including but not limited to chemical vapor deposition (CVD) methods, plasma enhanced chemical vapor deposition (PECVD) methods and physical vapor deposition (PVD) sputtering methods through which may be formed conformal dielectric layers of dielectric materials including but not limited to silicon oxide dielectric materials, silicon nitride dielectric materials and silicon oxynitride dielectric materials. For the preferred embodiment of the present invention, the planarized pre-metal dielectric (PMD) layer 20 is preferably formed from a silicon oxide dielectric material deposited through a plasma enhanced chemical vapor depsosition (PECVD) method and planarized through a chemical mechanical polish (CMP) planarizing method or reactive ion etch (RIE) etchback planarizing method, as is common in the art. Preferably, the planarized pre-metal dielectric (PMD) layer 20 is from about 7000 to about 11000 angstroms thick.

As is understood by a person skilled in the art, there may exist circumstances where the planarized pre-metal dielectric (PMD) layer 20 within the preferred embodiment of the method of the present invention is preferably formed from a gap filling sandwich composite dielectric layer construction formed through the method of the present invention. Such circumstances may occur when electrical circuit elements or structures formed upon the semiconductor substrate 10, such as the field effect transistor (FET) formed within the active region of the semiconductor substrate 10, define a sufficiently narrow aperture with a sufficiently high aspect ratio such that the planarized pre-metal dielectric (PMD) layer 20 cannot be reproducibly formed void free. Although such circumstances are not precluded within an integrated circuit within which may be employed the gap filling sandwich composite dielectric layer construction of the present invention, such circumstances will typically not occur. Thus, the preferred embodiment of the present invention does not illustrate a gap filling sandwich composite dielectric layer construction formed through the method of the present invention in the location of the planarized pre-metal dielectric (PMD) layer 20. As is further understood by a person skilled in the art, when a gap filling sandwich composite dielectric layer construction formed through the method of the present invention is formed in the location of the planarized pre-metal dielectric (PMD) layer 20, the gap filling sandwich composite dielectric layer construction may provide additional advantages to the integrated circuit within which is formed the gap filling sandwich composite dielectric layer construction. Such additional advantages may include, but are not limited to, improved hot carrier hardness within field effect transistors (FETs) within the integrated circuit within which is formed the gap filling sandwich composite dielectric layer construction.

Finally, there is shown within FIG. 1 a pair of patterned first conductor layers 22a and 22b formed upon the planarized pre-metal dielectric (PMD) layer 20. It is the pair of patterned first conductor layers 22a and 22b which form a patterned layer upon which the preferred embodiment of the gap filling sandwich composite dielectric layer construction of the present invention is formed. The method of the present invention, and the sandwich composite dielectric layer construction formed through the method of the present invention, provide most value in forming an inter-metal dielectric (IMD) sandwich composite dielectric layer construction upon the pair of patterned first conductor layers 22a and 22b when the pair of patterned first conductor layers 22a and 22b form an aperture of width W1 of from about 0.35 to about 0.65 microns, where the aperture of width WI has an aspect ratio H1/W1 of greater than about 1.5:1, where W1 and H1 are illustrated in FIG. 1. Under such circumstances, there is most likely to be formed a void within a conformal dielectric layer otherwise formed upon the pair of patterned conductor layers 22a and 22b absent a gap filling sandwich composite dielectric layer construction such as the gap filling sandwich composite dielectric layer construction formed through the method of the present invention. The gap filling sandwich composite dielectric layer construction formed through the method of the-present invention may also, however, be formed upon electrical circuit elements and patterned layers defining apertures having widths and aspect ratios within other ranges of values. In addition, the gap filling sandwich composite dielectric layer construction formed through the method of the present invention may also be formed upon patterned layers other than patterned conductor layers, such as the patterned conductor layers 22a and 22b. Such other patterned layers may include, but are not limited to patterned dielectric layers, patterned semiconductor layers and patterned photoactive layers.

Methods and materials through which patterned conductor layers may be formed within integrated circuits are known in the art of integrated circuit fabrication. Patterned conductor layers are typically, although not exclusively, formed within integrated circuit through patterning through methods as are conventional in the art of blanket conductor layers formed within integrated circuits. The blanket conductor layers may be formed within integrated circuits through methods including but not limited to thermally assisted evaporation methods, electron beam assisted evaporation methods, chemical vapor deposition (CVD) methods and physical vapor deposition (PVD) sputtering methods through which may be formed blanket conductor layers of conductor materials including but not limited to metals and metal alloys. For the preferred embodiment of the method of the present invention, the pair of patterned first conductor layers 22a and 22b is preferably formed through patterning through photolithographic and reactive ion etch (RIE) etch methods as are conventional in the art of a blanket first conductor layer formed at least in part of an aluminum containing conductor alloy, as is also common in the art. Preferably, each of the patterned first conductor layers 22a and 22b is from about 6500 to about 7500 angstroms thick.

Referring now to FIG. 2, there is shown a schematic cross-sectional diagram illustrating the results of further processing of the integrated circuit whose schematic cross-sectional diagram is illustrated in FIG. 1. Shown in FIG. 2 is a schematic cross-sectional diagram of an integrated circuit otherwise equivalent to the integrated circuit whose schematic cross-sectional diagram is illustrated in FIG. 1 but upon whose surface is formed a first gap filling sandwich composite dielectric layer construction formed from: (1) a first conformal inter-metal dielectric (IMD) layer 24 formed upon the integrated circuit whose schematic cross-sectional diagram is illustrated in FIG. 1; (2) a first gap filling dielectric layer 26 formed upon the first conformal inter-metal dielectric (IMD) layer 24; and (3) a second conformal inter-metal dielectric (IMD) layer 28 formed upon the first gap filling dielectric layer 26. Within the first gap filling sandwich composite dielectric layer construction, the first conformal inter-metal dielectric (IMD) layer 24 is preferably formed through a plasma enhanced chemical vapor deposition (PECVD) method employing a first radio frequency power optimized primarily to limit damage to the pair of patterned first conductor layers 22a and 22b, the planarized pre-metal dielectric (PMD) layer 20 and any electrical circuit elements formed within and/or upon the semiconductor substrate 10, such as the field effect transistor (FET) formed within and upon the active region of the semiconductor substrate 10. The first radio frequency power is also optimized secondarily to limit moisture permeation through the first conformal inter-metal dielectric (IMD) layer 24. Materials through which may be formed the first conformal inter-metal dielectric (IMD) layer 24 are known in the art of integrated circuit fabrication. Such materials are analogous to the materials from which may be formed the planarized pre-metal dielectric (PMD) layer 20. Preferably, the first conformal inter-metal dielectric (IMD) layer 24 is formed from a silicon oxide material deposited through the first plasma enhanced chemical vapor deposition (PECVD) method employing tetra-ethyl-ortho-silicate (TEOS) as a silicon source material. Preferably, the first conformal inter-metal dielectric (IMD) layer 24 so formed is formed to a thickness of from about 1000 to about 2000 angstroms. While alternative materials may also be employed in forming the first conformal inter-metal dielectric (IMD) layer 24, there may also be observed differences in the first radio frequency power needed to optimize primarily the limited plasma induced damage to the pair of patterned conductor layers 22a and 22b, the planarized pre-metal dielectric (PMD) layer 20 and electrical circuit elements formed within and/or upon the semiconductor substrate 10 while simultaneously optimizing secondarily moisture permeation through the first conformal inter-metal dielectric (IMD) layer 24.

Preferably, the first radio frequency power employed in the first plasma enhanced chemical vapor deposition (PECVD) method when forming the first conformal inter-metal dielectric (IMD) layer 24 employing tetra-ethyl-ortho-silicate (TEOS) as a silicon source material is from about 400 to about 600 watts at a first radio frequency of 13.56 MHZ. Other conditions employed within the first plasma enhanced chemical vapor deposition (PECVD) method when forming the first conformal inter-metal dielectric (IMD) layer 24 preferably include: (1) a reactor chamber pressure of from about 6 to about 10 torr; (2) a substrate temperature of from about 380 to about 420 degrees centigrade; (3) an aggregate tetra-ethyl-ortho-silicate (TEOS) silicon source material and helium background carrier gas flow rate of from about 700 to about 900 standard cubic centimeters per minute (sccm); and (5) an oxygen oxidant flow rate of from about 500 to about 700 standard cubic centimeters per minute (sccm).

With regard to the first gap filling dielectric layer 26, the first gap filling dielectric layer may be formed from any of several gap filling dielectric materials as are known in the art of integrated circuit fabrication, including but not limited to spin-on-glass (SOG) gap filling dielectric materials, atmospheric pressure chemical vapor deposited (APCVD) gap filling dielectric materials and sub-atmospheric pressure chemical vapor deposited (SACVD) gap filling dielectric materials. Preferably, the fist gap filling dielectric layer 26 is formed over the first conformal inter-metal dielectric (IMD) layer 24 to a thickness sufficient such that the second conformal inter-metal dielectric (IMD) layer 28, when formed upon the first gap filling dielectric layer 26, will not exhibit voids formed within the second conformal inter-metal dielectric (IMD) layer 28.

Preferably, the first gap filling dielectric layer 26 is formed from a silicon oxide gap filling dielectric material formed through an ozone assisted sub-atmospheric pressure chemical vapor deposition (SACVD) method employing tetra-ethyl-ortho-silicate (TEOS) as a silicon source material. Preferably, the ozone assisted sub-atmospheric pressure chemical vapor deposition (SACVD) method employs ozone as an oxidant at an ozone:tetra-ethyl-ortho-silicate (TEOS) molar ratio of from about 10:1 to about 15:1. Other conditions under which is formed the first gap filling dielectric layer 26 of the silicon oxide gap filling dielectric material through the ozone assisted sub-atmospheric pressure chemical vapor deposition (SACVD) method employing tetra-ethyl-ortho-silicate (TEOS) as the silicon source material include: (1) a reactor chamber pressure of from about 400 to about 600 torr; (2) a substrate temperature of from about 380 to about 420 degrees centigrade; (3) an ozone flow rate of from about 400 to about 550 standard cubic centimeters per minute; (4) a tetra-ethyl-ortho-silicate (TEOS) flow rate of from about 30 to about 55 standard cubic centimeters per minute in a helium carrier gas flow rate of from about 2000 to about 2600 standard cubic centimeters per minuet (sccm); and (5) an oxygen (ozone carrier gas) flow rate of from about 4000 to about 6000 standard cubic centimeters per minute.

With respect to the second conformal inter-metal dielectric (IMD) layer 28, the second conformal inter-metal dielectric (IMD) layer 28 is preferably formed through a second plasma enhanced chemical vapor deposition (PECVD) method otherwise equivalent to the first plasma enhanced chemical vapor deposition method through which is formed the first conformal inter-metal dielectric (IMD) layer 24, but at a second radio frequency power chosen primarily to limit moisture permeation through the second conformal inter-metal dielectric (IMD) layer 28. Preferably the second radio frequency power which optimally limits moisture permeability through the second conformal inter-metal dielectric (IMD) layer 28 is from about 600 to about 800 watts at a radio frequency of 13.56 MHZ. Preferably, the second conformal inter-metal dielectric (IMD) layer 28 is from about 17000 to about 21000 angstroms thick.

As is understood by a person skilled in the art, a gap filling sandwich composite dielectric layer construction, such as the first gap filling sandwich composite dielectric layer construction comprised of the first conformal inter-metal dielectric (IMD) layer 24, the first gap filling dielectric layer 26 and the second conformal inter-metal dielectric (IMD) layer 28, may be formed in locations within an integrated circuit, such as the integrated circuit whose schematic cross-sectional diagram is illustrated in FIG. 2, upon patterned layers other than upon the pair of patterned first conductor layers 22a and 22b as illustrated in FIG. 2. In that regard, a schematic cross-sectional diagram which illustrates the results of forming a second gap filling sandwich composite dielectric layer construction within the integrated circuit whose schematic cross-sectional diagram is illustrated in FIG. 2 is shown by the integrated circuit whose schematic cross-sectional diagram is illustrated in FIG. 3.

Shown in FIG. 3 is a schematic cross-sectional diagram of an integrated circuit otherwise equivalent the integrated circuit whose schematic cross-sectional diagram is illustrated in FIG. 2, but within which the second conformal inter-metal dielectric (IMD) layer 28 has been planarized to form the second planarized inter-metal dielectric (IMD) layer 28', typically and preferably through a method analogous to the method employed in planarizing the planarized pre-metal dielectric (PMD) layer 20. Preferably, the thickness of the second planarized inter-metal dielectric (IMD) layer 28' is from about 2000 to about 6000 angstroms. There is also then shown in FIG. 3 the presence of: (1) a pair of patterned second conductor layers 30a and 30b formed upon the second planarized inter-metal dielectric (IMD) layer 28'; (2) a third conformal inter-metal dielectric (IMD) layer 32 formed upon the second planarized inter-metal dielectric (IMD) layer 28' and the patterned second conductor layers 30a and 30b; (3) a second gap filling dielectric layer 34 formed upon the third conformal inter-metal dielectric (IMD) layer 32; and (4) a fourth conformal inter-metal dielectric (IMD) layer 36 formed upon the second gap filling dielectric layer 34.

Preferably: (1) the pair of patterned second conductor layers 30a and 30b are formed through methods, materials and dimensions equivalent to the methods, materials and dimensions employed in forming the pair of patterned first conductor layers 22a and 22b; (2) the third conformal inter-metal dielectric (IMD) layer 32 is formed through methods, materials and dimensions equivalent to the methods, materials and dimensions employed in forming the first conformal inter-metal dielectric (IMD) layer 24; (3) the second gap filling dielectric layer 34 is formed through methods, materials and dimensions equivalent to the methods, materials and dimensions employed in forming the first gap filling dielectric layer 26; and (4) the fourth conformal inter-metal dielectric (IMD) layer 36 is formed through methods, materials and dimensions equivalent to the methods, materials and dimensions employed in forming the second conformal inter-metal dielectric (IMD) layer 28.

Upon forming the fourth conformal inter-metal dielectric (IMD) layer 36, there is formed an integrated circuit having formed therein: (1) a first gap filling and planarizing sandwich composite dielectric layer construction formed from the first conformal inter-metal dielectric (IMD) layer 24, the first gap filling dielectric layer 26 and the second planarized inter-metal dielectric (IMD) layer 28'; and (2) a second gap filling sandwich composite dielectric layer construction formed from the third conformal inter-metal dielectric (IMD) layer 32, the second gap filling dielectric layer 34 and the fourth conformal inter-metal dielectric (IMD) layer 36. Both the first gap filling and planarizing sandwich composite dielectric layer construction and the second gap filling sandwich composite dielectric layer construction have optimally limited moisture permeation through the first gap filling and planarizing sandwich composite dielectric layer construction and second gap filling sandwich composite dielectric layer construction while avoiding plasma induced damage to patterned layers, such as patterned conductor layers, and electrical circuit elements, such as field effect transistors (FETs), formed beneath those gap filling sandwich composite dielectric layer constructions.

EXAMPLES

Upon the surface of each semiconductor substrate within a series of four semiconductor substrates having integrated circuit devices formed therein and thereupon was formed a first conformal dielectric lower layer of thickness about 1500 angstroms formed through a plasma enhanced chemical vapor deposition (PECVD) method employing tetra-ethyl-ortho-silicate (TEOS) as a silicon source material. The series of four first conformal dielectric lower layers was formed at: (1) a reactor chamber pressure of about 8 torr; (2) a substrate temperature of about 400 degrees centigrade; (3) an aggregate tetra-ethyl-ortho-silicate (TEOS) flow in background helium carrier gas flow of about 800 standard cubic centimeters per minute (sccm); and (4) an oxygen oxidant flow rate of about 600 standard cubic centimeters per minute (sccm). Two of the first conformal dielectric lower layers within the series of four conformal dielectric lower layers were formed at a first radio frequency power of about 500 watts and the remaining two first conformal dielectric lower layers within the series of four first conformal dielectric lower layers were formed at a first radio frequency power of about 675 watts.

Upon each of the four first conformal dielectric lower layers within the series of four first conformal dielectric lower layers was then formed a gap filling dielectric layer formed of a silicon oxide material formed through an ozone assisted sub-atmospheric pressure chemical vapor deposition (SACVD) method employing tetra-ethyl-ortho-silicate (TEOS) as a silicon source material at a thickness of about 5000 angstroms. Each gap filling dielectric layer within the series of four gap filling dielectric layers was formed at: (1) a reactor chamber pressure of about 500 torr; (2) a substrate temperature of about 400 degrees centigrade; (3) an ozone flow rate of about 490 standard cubic centimeters per minute (sccm); (4) a tetra-ethyl-ortho-silicate (TEOS) flow rate of about 40 standard cubic centimeters per minute (sccm) within a helium carrier gas flow rate of about 2300 standard cubic centimeters per minute (sccm); and (5) an oxygen (ozone carrier gas) flow rate of about 5000 standard cubic centimeters per minute (sccm). The ozone to tetra-ethyl-ortho-silicate (TEOS) volume ratio was about 12:1.

Upon each gap filling dielectric layer within the series of four gap filling dielectric layers was then formed a second conformal dielectric upper layer of thickness about 19000 angstroms. Each second conformal dielectric upper layer within the series of four second conformal dielectric upper layers was formed of a silicon oxide material deposited through a plasma enhanced chemical vapor deposition (PECVD) method employing tetra-ethyl-ortho-silicate (TEOS) as a silicon source material under deposition conditions otherwise equivalent to the deposition conditions employed in forming the series of four first conformal dielectric lower layers. Similarly to the series of four first conformal dielectric lower layers, two of the second conformal dielectric upper layers within the series of four second conformal dielectric upper layers was formed at a second radio frequency power of about 500 watts and the remaining two second conformal dielectric upper layers within the series of four second conformal dielectric upper layers was formed at a second radio frequency power of about 675 watts. The series of four second conformal dielectric upper layers was then planarized to form a series of four second planarized dielectric upper layers at a thickness of about 4000 angstroms each and there was then formed upon the semiconductor substrates additional equivalent layers to complete fabrication. The series of four sandwich composite dielectric layer constructions formed from the series of four first conformal dielectric lower layers, the series of four gap filling dielectric layers and the series of four second planarized dielectric upper layers so formed encompassed a series of four permutations of the radio frequency powers at which were formed the first conformal dielectric lower layers and the second conformal dielectric upper layers.

For each of the four sandwich composite dielectric layer constructions within the series of four sandwich composite dielectric layer constructions there was then measured the direct current (DC) accelerated stress performance of the integrated circuit devices formed within and upon the semiconductor substrates over which were formed those four sandwich composite dielectric layer constructions. The direct current (DC) accelerated stress performance measurements were undertaken through a method as is conventional in the art. The measured values for direct current (DC) accelerated stress performance DC(Y), where higher values of DC(Y) indicate enhanced performance, for integrated circuit devices formed beneath the four sandwich composite dielectric layer constructions are reported in Table I.

TABLE I

| Example | Lower Layer | Gap Fill | Upper Layer | DC (Y) |
|---|---|---|---|---|
| 1 | 500 W PE-TEOS | O3-TEOS | 500 W PE-TEOS | 0.027 |
| 2 | 500 W PE-TEOS | O3-TEOS | 675 W PE-TEOS | 0.171 |

TABLE I-continued

| Example | Lower Layer | Gap Fill | Upper Layer | DC (Y) |
|---|---|---|---|---|
| 3 | 675 W PE-TEOS | O3-TEOS | 500 W PE-TEOS | 0.044 |
| 4 | 675 W PE-TEOS | O3-TEOS | 675 W PE-TEOS | 0.086 |

From review of the data in Table I, it is seen that the measured value of DC (Y) is optimally high for integrated circuit devices formed beneath the sandwich composite dielectric layer construction whose composition is indicated in Example 2, where the first conformal dielectric lower layer is formed at a comparatively low first radio frequency power of about 500 watts which is: (1) optimized primarily to limit plasma induced damage to the semiconductor substrate beneath the first conformal dielectric lower layer; and (2) optimized secondarily to limit moisture permeation through the first conformal dielectric lower layer, while the second conformal dielectric upper layer is formed at a comparatively high second radio frequency power of about 675 watts optimized primarily to limit moisture permeation through the second conformal dielectric upper layer.

A series of two additional sandwich composite dielectric layer constructions was fabricated in accord with the sandwich composite dielectric layer constructions of Examples 3 and 4, with two exceptions. The first exception was that the gap filling layers formed of a silicon oxide dielectric material formed through the ozone assisted sub-atmospheric pressure chemical vapor deposition (SACVD) method were replaced by gap filling layers formed of a spin-on-glass (SOG) silicon oxide dielectric material formed to a thickness of about 5000 angstroms. The gap filling layers formed from the spin-on-glass (SOG) silicon oxide dielectric material were formed from an organo-functional siloxane spin-on-glass (SOG) dielectric material available from Allied-Signal, Inc., Morristown, N.J. as product number 314 organo-functional siloxane spin-on-glass (SOG) dielectric material. The second exception was that the first conformal dielectric lower layers were formed form a silicon oxide material of thickness about 2000 angstroms deposited through a plasma enhanced chemical vapor deposition (PECVD) method employing silane as a silicon source material. The first conformal dielectric lower layers deposited through the plasma enhanced chemical vapor deposition (PECVD) method employing silane as the silicon source material were formed at: (1) a radio frequency power of about 260 watts; (2) a reactor chamber pressure of about 2.2 mtorr; (3) a substrate temperature of about 400 degrees centigrade; (4) a silane flow rate of about 120 standard cubic centimeters per minute (sccm); and (5) a nitrous oxide (N2O) oxidant flow rate of about 1100 standard cubic centimeters per minute (sccm). Similarly to the sandwich composite dielectric layer constructions in Examples 1–4, the direct current (DC) accelerated stress performance (ie: DC (Y)) measurement for devices over which were formed these additional two sandwich composite dielectric layer constructions was also determined employing the same method as employed in measuring the direct current (DC) accelerated stress performance for devices over which were formed the sandwich composite dielectric layer constructions whose compositions are shown in Examples 1–4. The measured values of DC (Y) for these additional two sandwich composite dielectric layer constructions are reported in Table II.

TABLE II

| Example | Lower Layer | Gap Fill | Upper Layer | DC (Y) |
|---|---|---|---|---|
| 5 | 260 W PE-SiH4 | SOG | 500 W PE-TEOS | 0.227 |
| 6 | 260 W PE-SiH4 | SOG | 675 W PE-TEOS | 0.310 |

From review of the data in Table II, it is seen that a comparatively high radio frequency power of about 675 watts employed in forming the second conformal dielectric upper layer within a sandwich composite dielectric layer construction also provides a higher measured value of DC (Y) when: (1) the first conformal dielectric lower layer within the sandwich composite dielectric layer construction is formed from a silicon oxide material formed through a plasma enhanced chemical vapor deposited (PECVD) method employing silane as a silicon source material; and (2) the gap filling layer is formed from silicon oxide layer formed from a spin-on-glass (SOG) dielectric material.

In order to more fully investigate the role of the first radio frequency power within the plasma enhanced chemical vapor deposition (PECVD) method through which the first conformal dielectric lower layer was formed within Examples 1–4, a third series of sandwich composite dielectric layer constructions was fabricated upon a third series of semiconductor substrates in a manner otherwise equivalent to the manner in which was fabricated the sandwich composite dielectric layer constructions within Examples 1–4, but with two exceptions. The first exception was that the second conformal dielectric upper layers were formed of a silicon oxide material deposited to a thickness of about 19000 angstroms through a plasma enhanced chemical vapor deposition (PECVD) method employing silane as a source material employing deposition conditions otherwise equivalent to the deposition conditions employed in forming the first conformal dielectric lower layers within the sandwich composite dielectric layer constructions whose compositions are shown in Example 5 and Example 6. The second conformal dielectric upper layers so formed were similarly planarized to form second planarized dielectric upper layers of thickness about 4000 angstroms. The second exception was that one of the first conformal dielectric lower layers was formed at a first radio frequency power of about 325 watts, in addition to the other two first conformal dielectric layers which were formed at a first radio frequency power of about 500 watts and a radio frequency power of about 675 watts. Similarly to Examples 1–6, the accelerated direct current (DC) accelerated stress performance (ie: DC(Y)) of devices formed within the semiconductor substrates beneath the three sandwich composite dielectric layers within this series of Examples was also measured through the same method as employed in measuring the direct current (DC) accelerated stress performance for the devices formed beneath the sandwich composite dielectric layers constructions whose compositions are shown in Examples 1–6. The results of the measurements are reported in Table III.

TABLE III

| Example | Lower Layer | Gap Fill | Upper Layer | DC (Y) |
|---|---|---|---|---|
| 7 | 325 W PE-TEOS | O3-TEOS | 260 W PE-SiH4 | 0.059 |
| 8 | 500 W PE-TEOS | O3-TEOS | 260 W PE-SiH4 | 0.083 |
| 9 | 675 W PE-TEOS | O3-TEOS | 260 W PE-SiH4 | 0.053 |

As is seen from review of the data in Table III, employing otherwise equivalent condition including a second conformal dielectric upper layer formed from a silicon oxide material deposited through a plasma enhanced chemical vapor deposition (PECVD) method employing silane as a silicon source material, there is formed a sandwich composite dielectric layer construction yielding an optimally high DC (Y) measurement when a lower lying conformal dielectric layer is formed from a silicon material deposited through a first plasma enhanced chemical vapor deposition (PECVD) method employing tetra-ethyl-ortho-silicate (TEOS) as a silicon source material at a first radio frequency power of about 500 watts. At the higher first radio frequency power of about 675 watts the first conformal dielectric lower layer presumably experiences plasma damage resulting in the reduced value for the measured DC (Y). At the lower first radio frequency power of about 325 watts, the first conformal dielectric lower layer presumably experiences enhanced moisture permeability resulting in the reduced value for the measured DC (Y).

In order to demonstrate the limited moisture permeability of silicon oxide dielectric layers formed through a plasma enhanced chemical vapor deposition (PECVD) method employing tetra-ethyl-ortho-silicate (TEOS) as a silicon source material at elevated radio frequency plasma powers, there was formed upon a series of three semiconductor substrates a series of three silicon oxide conformal dielectric layers formed through a plasma enhanced chemical vapor deposition (PECVD) method otherwise equivalent to the plasma enhanced chemical vapor deposition (PECVD) method employed in forming the first conformal dielectric lower layers employed within the sandwich composite dielectric layer constructions whose compositions are shown in Example 7–9, with the exception that there was employed the radio frequency powers of 300, 500 and 675 watts rather than the radio frequency powers of 325, 500 and 675 watts. There was then measured for these three silicon oxide dielectric layers: (1) the film stress; and (2) the moisture thermally desorbable from each individual film within the range of about 170 to about 650 degrees centigrade. The film stress and moisture desorbtion measurements were undertaken through methods as are conventional in the art. For comparison purposes, a film stress measurement and a moisture desorption measurement were also obtained for an otherwise equivalent conformal silicon oxide dielectric layer of thickness about 4000 angstroms formed through a plasma enhanced chemical vapor deposition (PECVD) method employing silane as a silicon source material at a radio frequency power of 260 watts. The results of the film stress measurements and moisture permeability measurements are reported in Table IV, where the moisture desorption measurements for the silicon oxide dielectric layers formed employing tetra-ethyl-ortho-silicate (TEOS) as a silicon source material are normalized to the moisture desorption of the silicon oxide dielectric layer formed employing silane as the silicon source material.

TABLE IV

| Example | Conformal Layer | Moisture Desorp (170–650 C) | Film Stress (E9 dyn/cm2) |
|---|---|---|---|
| 10 | 260 W PE-SiH4 | 1.00 | 1.00 |
| 11 | 300 W PE-TEOS | 1.58 | 0.61 |
| 12 | 500 W PE-TEOS | 1.32 | 0.83 |
| 13 | 675 W PE-TEOS | 1.13 | 1.03 |

From review of the data in Table IV it is seen, as expected, that higher radio frequency powers employed in forming plasma enhanced chemical vapor deposited (PECVD)) conformal silicon oxide dielectric layers employing tetra-ethyl-ortho-silicate (TEOS) as a silicon source material provide silicon oxide dielectric layers with significant reductions in moisture absorbtion.

As is understood by a person skilled in the art, the preferred embodiment and examples of the present invention are illustrative of the present invention rather than limiting of the present invention. Revisions may be made to methods, materials, structures and dimensions through which is provided the preferred embodiment and examples of the sandwich composite dielectric layer construction of the present invention while still providing a sandwich composite dielectric layer construction within the spirit and scope of the present invention, as defined by the appended claims.

What is claimed is:

1. A method for forming for use within an integrated circuit a gap filling sandwich composite dielectric layer construction comprising:

providing a substrate;

forming upon the substrate a patterned layer;

forming upon the patterned layer a single layer first conformal dielectric layer, the single layer first conformal dielectric layer being formed through a first plasma enhanced chemical vapor deposition (PECVD) method employing a first source material, the first plasma enhanced chemical vapor deposition (PECVD) method also employing a single first radio frequency power optimized primarily to limit plasma induced damage to the substrate and the patterned layer, the single first radio frequency power also being optimized secondarily to limit moisture permeation through the single layer first conformal dielectric layer;

forming upon the single layer first conformal dielectric layer a gap filling dielectric layer; and forming upon the gap filling dielectric layer a second conformal dielectric layer, the second conformal dielectric layer being formed through a second plasma enhanced chemical vapor deposition (PECVD) method employing a second source material, the second plasma enhanced chemical vapor deposition (PECVD) method also employing a second radio frequency power optimized primarily to limit moisture permeation through the second conformal dielectric layer.

2. The method of claim 1 wherein:

the first source material and the second source material are not formed of the same material; and the single layer first conformal dielectric layer is formed from a silicon oxide dielectric material deposited employing tetra-ethyl-ortho-silicate (TEOS) as a first silicon source material at the first radio frequency power of from about 400 to about 600 watts; and the second conformal dielectric layer is formed from a silicon oxide dielectric material deposited employing silane as a second silicon source material.

3. The method of claim 1 wherein the single layer first conformal dielectric layer is formed to a thickness of from about 1000 to about 2000 angstroms.

4. The method of claim 1 wherein the gap filling dielectric layer is formed from a silicon oxide gap filling dielectric layer chosen from the group of silicon oxide gap filling dielectric layers consisting of spin-on-glass (SOG) silicon oxide gap filling dielectric layers, ozone assisted atmospheric pressure chemical vapor deposited (APCVD) silicon oxide gap filling dielectric layers and ozone assisted sub-atmospheric pressure chemical vapor deposited (SACVD) silicon oxide gap filling dielectric layers.

5. The method of claim 1 wherein:
- the first source material and the second source material are not formed of the same material; and
  - the second conformal dielectric layer is formed from a silicon oxide dielectric material deposited employing tetra-ethyl-ortho-silicate (TEOS) as a second silicon source material at the second radio frequency power of from about 600 to about 800 watts; and
  - the single layer first conformal dielectric layer is formed from a silicon oxide dielectric material deposited employing silane as a first silicon source material.

6. The method of claim 1 wherein the second conformal dielectric layer is formed to a thickness of from about 17000 to about 21000 angstroms.

7. The method of claim 1 further comprising planarizing the second conformal dielectric layer to form a gap filling and planarizing sandwich composite dielectric layer construction, the planarizing yielding from the second conformal dielectric layer a second planarized dielectric layer of thickness from about 2000 to about 6000 angstroms.

8. The method of claim 1 further comprising forming at least one field effect transistor (FET) within and upon the substrate.

9. The method of claim 1 wherein:
- the first source material and the second source material are formed of the same material; and
  - the single layer first conformal dielectric layer is formed from a silicon oxide dielectric material deposited employing tetra-ethyl-ortho-silicate (TEOS) as a first silicon source material at the single first radio frequency power of from about 400 to about 600 watts: and
  - the second conformal dielectric layer is formed from a silicon oxide dielectric material deposited employing tetra-ethyl-ortho-silicate (TEOS) as a second silicon source material at the second radio frequency power of from about 600 to about 800 watts.

* * * * *